United States Patent
Spehr

(10) Patent No.: US 6,414,319 B1
(45) Date of Patent: Jul. 2, 2002

(54) ELECTRON OPTICAL LENS SYSTEM WITH A SLOT-SHAPED APERTURE CROSS SECTION

(76) Inventor: Rainer Spehr, Erfurter Strasse 19, D-64372 Ober-Ramstadt (DE)

( * ) Notice: Subject to any disclaimer, the term of this patent is extended or adjusted under 35 U.S.C. 154(b) by 0 days.

(21) Appl. No.: 09/242,431
(22) PCT Filed: Jul. 23, 1997
(86) PCT No.: PCT/DE97/01588
   § 371 (c)(1),
   (2), (4) Date: Mar. 29, 1999
(87) PCT Pub. No.: WO98/09313
   PCT Pub. Date: Mar. 5, 1998

(30) Foreign Application Priority Data

Aug. 26, 1996 (DE) ......................... 196 34 456

(51) Int. Cl.$^7$ ................................. H01J 37/14
(52) U.S. Cl. ......................... 250/396 ML; 250/396 R
(58) Field of Search ...................... 250/396 R, 396 ML, 250/398

(56) References Cited

U.S. PATENT DOCUMENTS

| 4,546,258 A | * | 10/1985 | Chisholm | ............ | 250/396 ML |
| 4,629,899 A | * | 12/1986 | Plies | ................... | 250/396 ML |
| 4,789,787 A | * | 12/1988 | Parker | ................. | 250/396 ML |
| 4,958,078 A | * | 9/1990 | Becchetti | ............ | 250/396 ML |
| 4,962,309 A | * | 10/1990 | White et al. | ......... | 250/396 ML |
| 5,038,045 A | * | 8/1991 | Rouberol et al. | .... | 250/396 ML |

FOREIGN PATENT DOCUMENTS

| DE | 26 23 337 A | 12/1977 |
| DE | 41 05 121 A | 8/1992 |
| FR | 2350686 A | 12/1977 |

* cited by examiner

Primary Examiner—Bruce Anderson
(74) Attorney, Agent, or Firm—Edwin D. Schindler

(57) ABSTRACT

This invention concerns a lens system, particularly for focusing electrons, with a cylindrical lens with pole shoes or electrodes, between which an aperture is located. This aperture has a slot-shaped cross section perpendicular to the optical axis of the lens. The cylindrical lens (4) is combined with a magnetic lens (1) with which a quadripole field can be produced. The lenses are arranged with little or no distance between them and their optical axes run parallel to one another. The quadripole lens (1) has a slot-shaped aperture (10) which is oriented parallel to the opening (9–11) of the cylindrical lens (4). The focusing plane of the quadripole lens (1), which comprises the optical axis (19), is oriented parallel to the longitudinal axes of the apertures (9–11) and its defocusing plane perpendicular to the longitudinal axes. The refractive power of the cylindrical lens (4) can be set at twice that of the quadripole lens (1).

17 Claims, 2 Drawing Sheets

ELECTRON OPTICAL LENS SYSTEM WITH A SLOT-SHAPED APERTURE CROSS SECTION

Figure 1:
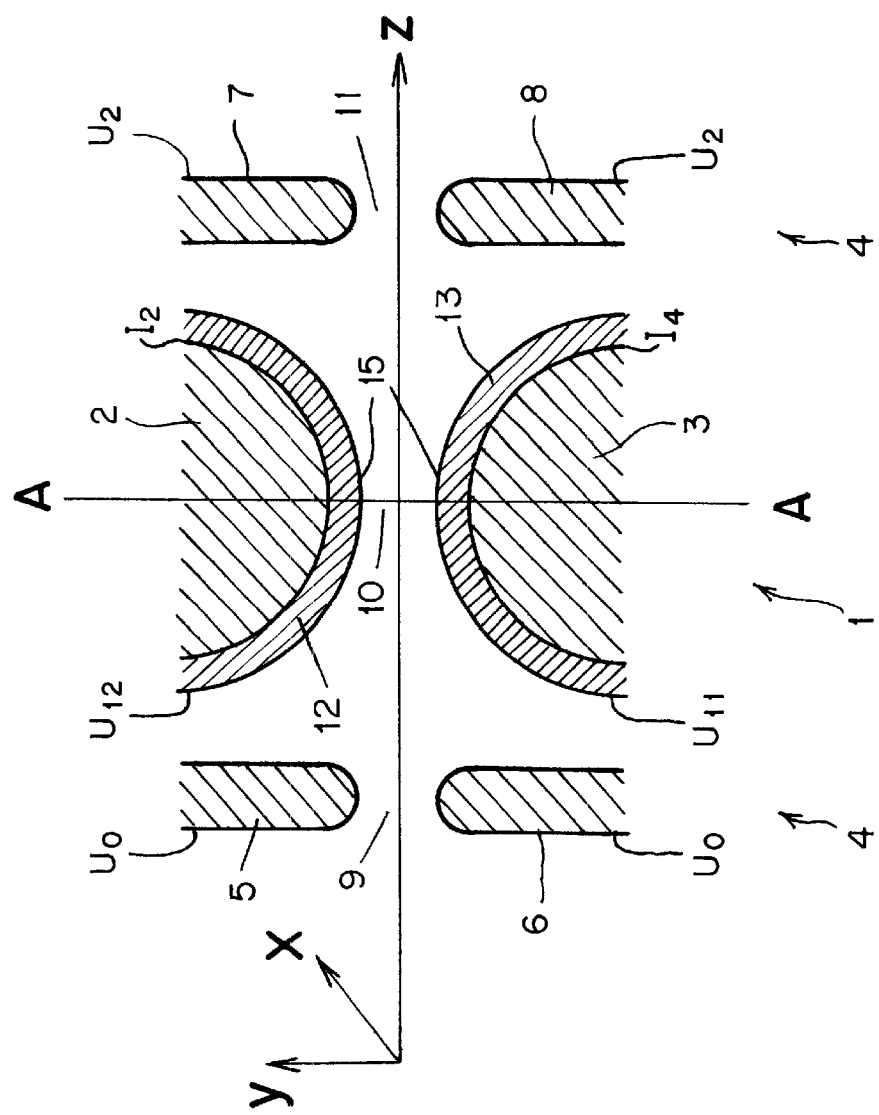

The invention concerns a lens system, particularly for focusing electrons, with a cylindrical lens with pole shoes or electrodes, between which an aperture is located. This aperture has a slot-shaped cross section perpendicular to the optical axis of the lens.

With the aid of electron-beam lithography, structures of a minimal size can be created, a substantial field of application being the production of electronic components and integrated circuits on the surface of disk-shaped semiconductor crystals (wafers). To focus the electrons, electron lens are required that have a short focal distance and whose usable writing field (i.e. the range in which the focal point can be moved parallel to the lens axis) is as large as possible.

Known for this purpose are so-called 'variable axis' lenses (H. C. Pfeiffer and G. O. Langner, J. Vac. Sci. Technol., 1983, pages 3 to 14), where a suitable a correction field is dynamically superimposed onto a field of a circular lens which determines the position of the flying spot. However, it proves disadvantageous that the usable field of action of these lenses is limited by the bore radius of the pole shoes which is limited by the size of the focal distance. In practice, there are thus writing regions with diameters in the range of one millimetre. In order to be able to process integrated circuits of a standard size or even a whole wafer, conventional lithographic systems thus require, in addition to the electron optics, a table with workpiece clamping devices which can be moved in a plane perpendicular to the electron beam. In this case the efficiency is limited by the mechanical parameters of the table, where the minimum size of the creatable structures depends on the guide accuracy and the speed of movement of the table determines the maximum writing speed.

Furthermore, known in the state-of-the-art are both electrostatic as well as magnetic cylindrical lenses to focus the electrons (H. Rose, Optik 36, 1972, pages 19 to 36). Cylindrical lenses are provided with electrodes or pole shoes which serve to guide the electric or magnetic field, and between which there is a slot-shaped aperture through which extend the possible trajectories of charged particles in the lens. Here the longitudinal axis of the slot-shaped axis is aligned perpendicular to the optical axis of the lens; the plane formed by the optical axis and the longitudinal axis is termed hereinafter the centre plane. For stigmatic imaging, i.e. the punctual imaging of punctual electron emitters and parallel incident rays, cylindrical lens are however unsuitable, as they focus only perpendicular to the direction of the slot, while movable components of the particles parallel to the direction of the slot remain uninfluenced. Thus bar-shaped, astigmatic punctual patterns obtain which are insufficient for lithographic purposes.

Finally the movement of charged particles can also be influenced via quadripole fields. Perpendicular to its plane a magnetic quadripole also acts as a lens. Standard images, however, cannot be generated in this way because the influence of a quadripole on a planar, parallel beam cluster depends on its angular position to the magnetic field. While the quadripole lens focuses parallel beams in a plane, which comprises the optical angle, it acts in the plane perpendicular thereto, which comprises the optical axis, so as to defocus a parallel beam cluster. Solely the amount of the focus distances can be set equally in both planes. Owing to these characteristics, quadripole lenses are unsuitable for standard optical imaging.

Against this background, the object of the invention is to develop a lens system in which the apertures for the electron beam are of optional length in one dimension and which produces stigmatic imaging.

This task is solved therein that the cylindrical lens is combined with a magnetic lens with which a quadripole field can be produced, the lenses are arranged with little or no distance between them and their optical axes run parallel to one another, the quadripole lens has a slot-shaped aperture which is oriented parallel to the opening of the cylindrical lens, the focusing plane of the quadripole lens, which comprises the optical axis, is oriented parallel to the longitudinal axes of the apertures and its defocusing plane perpendicular to the longitudinal axes and the refractive power of the cylindrical lenses can be set at twice that of the quadripole lens.

The central idea of the invention consists therein to combine one cylindrical lens with one magnetic quadripole lens, where the term quadripole lens comprises all lens within the meaning of the invention by means of which fields of quadripole symmetry can be produced, for instance also eight-pole lens. The optical axes of both lens extend parallel to each other and their principal planes match or are at a small distance to each other. The term 'small' is to be understood in the sense that the distance is small compared with the focusing length of both lens and the lens system can be described in good convergence by a single lens. Between its pole shoes the quadripole lens has a slot-shaped aperture, which is oriented parallel to the opening of the cylindrical lens, the length of both openings being optional. The projections of the two openings preferably match in the direction of the optical axis. The orientation of the quadripole lens is such that its focusing plans extends parallel to the longitudinal axis of the apertures and its defocusing plane perpendicular to the longitudinal axes. The refractive power of the cylindrical lens is suitably chosen so as to be twice that of the quadripole.

Resulting from this configuration, the quadripole lens provides a focusing effect in the plane of the slot where the focal distance is twice that of the cylindrical lens. Perpendicular to the direction of the slot the negative refractive power of the quadripole is overcompensated by the twice as high refractive power of the cylindrical lens. As a result a focal distance obtains which is also equal to twice that of the cylindrical lens. The result is thus a stigmatically focusing lens. Decisive for the coordination of the lens focal distances is solely that the sum of the refractive powers of the quadripole perpendicular to the slot longitudinal axis and the cylindrical lens is equal to the refractive power of the quadripole lens parallel to the slot longitudinal axis.

The advantage of the lens system consists therein that limitations of the beam path in the direction of the slot, as they exist in the case of circular lenses because of the bore radius of the pole shoe, are eliminated or substantially reduced. Nonetheless the system permits stigmatic imaging comparable to conventional circular lenses. In particular, no optical lens errors occur which are less than third order. Suitably in the majority of application cases the optical axis of the quadripole lens extends in the centre plane of the cylindrical lens. Furthermore it proves a significant advantage that along the slot, neglecting influences of the endwise slot edges, largely translation symmetry exists. Therefore the imaging characteristics are independent of the position of the optical axis of the quadripole in respect of the longitudinal axis of the slot. With suitable adjustment of the lens parameters, in particular the field intensities, imagings can of course also be produced with any other charged particles, for example ions which for instance are usable for the doping of semiconductors. Finally, it is conceivable for special applications that the coordination of the lens focal distances deviates from the above-mentioned setting, for instance to produce line-like structures on a workpeice with an astigmatic focal spot.

A preferred quadripole lens consists of one aperture on or at whose edges there extend current-carrying conductors. The conductors are oriented more or less parallel to the optical axis. Suitably the conductors here comprise coils wound on a yoke. The conductors or windings extend on the inside edges of the aperture, which face the optical axis, preferably without inclination, i.e. in the frame of production accuracy, exactly parallel to the optical axis in order to avoid distortions of the fields. On opposing edges of the aperture the direction of the currents is parallel, while the current flow on edges perpendicular thereto is oriented opposingly. Preferably the sum of all flows through the aperture is zero to avoid closed circulatory magnetic field lines, where the current densities on the short and long edges of slot-shaped aperture behave reversely proportional to the edge lengths. If the aperture is inserted in a material, for instance is enclosed by a yoke whose magnetic permeability is much higher than one, e.g. iron, the current intensity required to generate the fields is reduced.

As the simplest possibility for realising the necessary translation symmetry in the direction of the slot it is proposed that the apertures have square cross sections. As a result of the slot-shaped design the two edge lengths of the square differ considerably, In an advantageous embodiment of the invention the optical axis of the quadripole lens can be moved in a parallel direction. Thus its position can be changed so that the parallel orientation to the centre plane of the cylindrical lens is always maintained. With a long length of the slot or suitable compensation of edge effects the imaging characteristics of the lens system are virtually uninfluenced when the position of the optical axis of the quadripole along the longitudinal axis of the slot changes. Conceivable, however, is also to move the optical axis of the quadripole lens perpendicular or at an optional angle to the slot longitudinal axis, that is, its distance to the centre plane of the cylindrical lens.

For the purpose of moving the optical axis of the quadripole lens it presents itself to superimpose a magnetic dipole field onto the quadripole field. Dipole fields parallel to the slot direction produce shifts of the optical axis perpendicular to the slot, while dipole fields perpendicular to the slot direction shift the optical axis in the direction of the slot longitudinal axis. When the dipole field is generated by electric current the continuous movement of the optical axis by any amount is possible by varying the strength of the field current. Suitably, two dipole fields that are orthogonal to each other and the optical axis can be superimposed onto the quadripole field, which allows optional movement across the entire surface of the slot cross section.

In order to produce the dipole field opposing edges of the aperture are preferably provided with conductors which can be impinged with currents which are opposing on both edges and of the same amount. Possibly for this purpose the aperture has special conductors or coils. Alternatively those conductors can be used which serve to produce the quadripolar field. In the latter case the current flows sum in individual conductors or compensate one another partly so that as a result the total current on each opposing edge deviates.

Furthermore, it is advantageous if higher order electric or magnetic multipole fields can be superimposed onto the quadripole field. For this purpose, the aperture edges of the quadripole lens are preferably provided with conductors or coils whose surface density varies along individual edge sections. By means of these generally additional conductors, with the corresponding arrangement, the quadripole field can be superimposed with any magnetic multipole fields of a higher order. They serve to correct spherical aberrations of the lens, the correction fields usually being considerably weaker than the dipole and quadripole fields.

To avoid a distance between cylindrical and quadripole lenses it is proposed to dispose the quadripole lens inside the cylindrical lens. Generally, one cylindrical lens consists of several pole shoe pairs or electrodes at a distance to one another. These parts can be disposed in front of and after the quadripole lens in the direction of the optical axis.

In a preferred embodiment of the invention, the pole shoes or electrodes of the cylindrical lens also consist of a material of high magnetic permeability. As a result they limit the magnetic field of the quadripole lens in the direction of the optical axis, with a two-sided limitation is effected provided that the quadripole lens is disposed inside the cylindrical lens. Of special advantage thereby are the plate-shaped pole shoes or electrodes of the cylindrical lens whose surfaces extend perpendicular to the optical axis. This avoids disturbing the symmetry of the quadripole field.

As cylindrical lenses, both electrostatic as well as magnetic lenses have proved themselves. An electrostatic lens consists of a number, for example three, successive electrodes in the direction of the optical axis with one each slot-shaped aperture. Thereby the electric potential of the successive apertures differs. To achieve a simple and compact lens system structure it is proposed that one of the electrodes comprises the surfaces of the pole shoes of the quadripole lens. With a cylindrical lens with three electrodes, the quadripole lens comprises preferably the central electrode. Suitably, not the entire pole shoe is impinged by the electrode potential rather its surface is provided with an insulated electrode opposite to it.

If in the case of an electrostatic lens the endwise electrodes have differing potentials, an immersion lens is obtained, which changes the kinetic energy of the particles passing through. This development then proves specially advantageous if low particle energy is planned in the image space.

A substantial expansion of the application range is obtained if the quadripole lens can be impinged by an electric field perpendicular to the optical. Thus additional dynamic effects can be applied to the electrons and in particular a Wien filter for electrons can be produced. Wien filters known in the state of the art consist of electrostatic and magnetic fields perpendicular to each other and effect a directional focusing, the location of the image depending on the kinetic energy of the charged particles. Accordingly, in conjunction with screens and deflection devices Wien filters serve to produce monochromatic electron beams. In the case of the lens system according to the invention, the electric field is oriented perpendicular to the longitudinal axis of the slot, the magnetic dipole field parallel to the longitudinal axis. The direction of the fields is chosen so that the forces are opposed to moved, charged particles, in the case of a defined particle speed both force fields being compensated. It shows itself to be advantageous that the resulting force in the slot is constant along the entire centre plane. The dispersion can be adjusted infinitely by changing the electric or magnetic fields.

The proposed lens system is especially preferred for purposes of electron or ion beam lithography. In this case it is oriented onto a workpiece so that its focus is located on its surface. A parallel beam generated by a charged particle emitter is thus focused onto the surface. The workpiece, in particular a wafer comprising semiconductor material, is affixed in a clamping device which can be shifted perpendicular to the slot direction and the optical axis. The advantage compared with the embodiments standard in the state of the art with circular lenses consists therein that a mechanical movement of the clamping device is necessary solely in one dimension. The use of a two-dimensionally movable clamping device is however not ruled out. The shifting of the focus on the surface of the workpiece in the direction of the slot can be realised through an axial shift of the quadripole lens, for instance through the superimposition of a dipole field. In a perpendicular direction thereto a mechanical displacement of the workpiece continues to be effected. However, with a grid-like guidance of the electron beam across the surface considerable advantages are obtained. This is explained therein that with a line-wise scanning the beam must be moved rapidly in a line direction, while a change of line is effected solely at the end of the line. The movement when the line is changed can be effected considerably more slowly owing the small path to be travelled. Thus the requirements on the movement speed and movement path of the workpiece clamping device are reduced particularly if the longitudinal axis of the slot extends in the direction of the lines of the grid. A considerable acceleration of the machining process as well as an improved accuracy of guidance are the advantageous consequences.

Further details, features and advantages can be taken from the description part below in which a typical embodiment is explained in greater detail with the aid of the drawing. The drawing shows schematically FIG. 1: longitudinal section through the lens system, FIG. 2: cross section through the lens system along the line A—A.

FIG. 1 represents the cross section through a lens system which consists of a quadripole lens (1) with the pole shoes (2, 3) as well as a cylindrical lens (4), which, in addition to the plate-shaped electrodes (5–8), also comprises pole shoes (2, 3) as further electrodes. Between pole shoes (2, 3) and electrodes (5–8) are the apertures (9–11), which are aligned to one another in the direction of the Z axis which extends parallel to the optical axis of quadripole lens (1) and cylindrical lens (4). Perpendicular to the optical axis apertures (9–11) have a slot-shaped cross section, the longitudinal axis of the slot in the coordinate direction X being orientated perpendicular to the image plane.

In that electrodes (5–8) or surfaces of pole shoes (2, 3) of cylindrical axis (4) have different electric potentials U0, U1, U2, an incident parallel beam in the direction of the Z axis is focused on a line in the XZ plane parallel to the X axis, which comprises the centre plane of cylindrical lens (4). For this purpose the surfaces of pole shoes (2, 3) are provided with thin insulated electrodes. In order to guarantee symmetrical imaging characteristics, there is a reflecting symmetry of pole shoes (2, 3) and electrodes (5–8) to the XY plane. On the other hand, extended wave fronts in the X direction are not focused by the cylindrical lens (4) in the XZ plane.

Focusing within the XZ plane is produced with the magnetic quadripole lens (1), which on the surface of its pole shoes (2, 3) has electric conductors (12, 13) which extend parallel to the Z axis. Suitably, the conductors are windings on the pole shoes whose line density is constant in the X direction and which on the side of pole shoes (2, 3), which face the Z axis, lie preferably without inclination, that is, in the frame of production accuracy, exactly parallel to the Z axis so that there is no distortion of the magnetic fields they produce.

While the quadripole lens (1) focuses in the XZ plane in the direction of the electron beams incident in the Z axis, its refractive power is negative in the YZ plane, i.e. it defocuses the incident parallel beams as a dispersion lens. To enable stigmatic imaging on points of the image plane, the refractive power of the cylindrical lens (4) must exceed that of the quadripole lens (1) so that in the interaction of the two focusing is also effected in the YZ plane. Stigmatic focusing is effected when the refractive power of the cylindrical lens (4) is twice that of the quadripole because the combination of both lenses in this case both in the XZ as well as in the YZ planes has a focusing effect with the single refractive power of the quadripole.

Suitably, in addition to pole shoes (2, 3), electrodes (5–8) also consist of a material of high magnetic permeability so that they limit the magnetic quadripole field. Owing to the plate-shape and orientation perpendicular to the Z axis the field symmetry is not disturbed. In respect of its effect as components of the cylindrical lens (4), the electron pairs (5, 6) and (7, 8) can have the same electric potential (U0=U2) as well as different potentials. In the latter case, the cylindrical lens (4) is an immersion lens.

If electrodes (5–8) are replaced by magnetic pole shoes whose magnetic potential varies from zero in apertures (9, 11), a magnetic cylindrical lens (4) obtains which interacts in the same way with the quadripole lens (1). In this case, the trajectories of the electrons extend through three slots parallel to one another of which the first and last comprise the cylindrical lens, while the centre aperture (10) is the quadripole lens. If the potentials in the endwise apertures (9, 11) are identical, the Lamor rotations of the electrons are compensated via both parts of the cylindrical lens (4) in the first order.

Finally, it is possible, instead of a uniform potential U1 to impinge the surfaces of the pole shoes (2, 3) or the electrodes with different potentials U11, U12, which generate an electric field in the direction of the Y axis. Via a crossing magnetic dipole field in the X direction a Wien filter for electrons is produced which effects a directional focusing which depends on the kinetic energy. The fields in this case are orientated so that their dynamic effect on the moved particles compensate one another. The nominal energy of the Wien filter produces preferably a focusing on the Z axis. By changing the potentials U11 and U12, the filter dispersion is infinitely adjustable.

Figure 2:
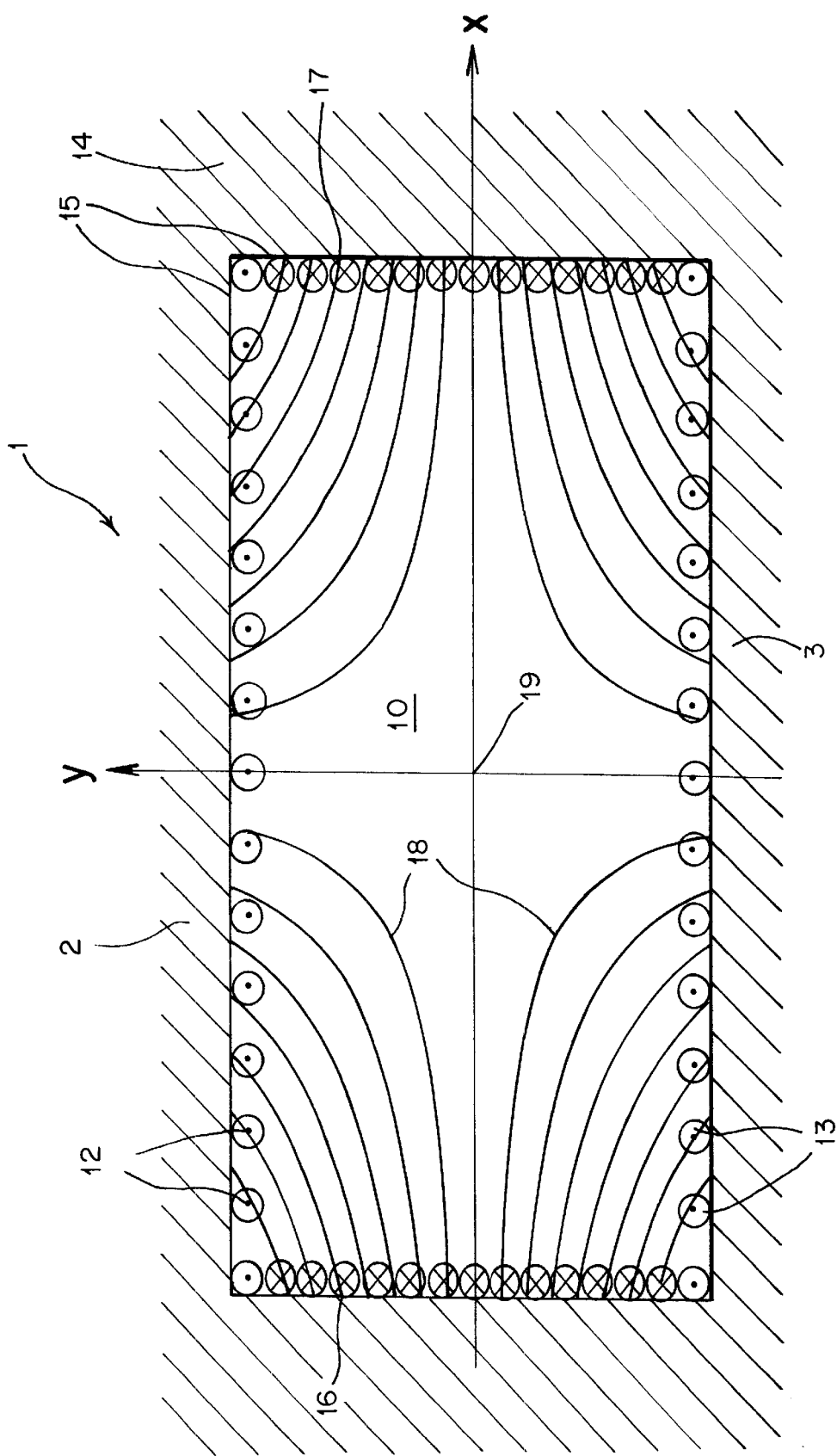

FIG. 2 shows a cross section along the line A—A through the quadripole lens (1) in FIG. 1. Thereby aperture (10) of the quadripole lens is enclosed by a material (14) of a high permeability, which comprises the pole shoes (2, 3) on the top and bottom sides of aperture (10). The edges (15) of aperture (10) are covered by electric conductors (12, 13, 16, 17) in which the current flow is effected perpendicular to the image plane, that is, in the Z direction. The current flow through the conductors (12, 13) on the top and bottom edges (15) is directed out from the image plane, whereas the flow in conductors (16, 17) on the left and right edges (15) is effected into the image plane. The total current on every edge (15) of aperture (10) is thereby uniform so that the current density on straight edge sections is reversely proportional to its length and the sum of all currents through aperture (10) is thus zero. As a result a magnetic quadripole field is produced the extension of which is represented by the equipotential line (18).

If conductors (12, 13) or (16, 17) on opposing edges (15) are impinged additionally with opposing, equal currents, a magnetic dipole field is produced which superimposes onto the quadripole field. The superimposition of the dipole field with the quadripole field results in a displacement of the latter, where optional displacements can be produced in that, where necessary, different boosting currents in conductors (12, 13) and conductors (16, 17) produce two dipole components which are perpendicular to each other. Especially in the case of a slot-shaped aperture (10), which is long-stretched out in the X direction the optical axis of the lens system can be displaced with the optical axis (19) of the quadripole along the slot longitudinal axis without changing the imaging characteristics.

In sum, a stigmatic imaging electron optics with a slot-shaped aperture cross section obtains, whose optical axis can easily be shifted along the slot through application of a magnetic dipole field.

I claim:

1. A lens system for use in focusing electrons, comprising:
   a cylindrical lens having pole shoes or electrodes, between which pole shoes or electrodes an aperture is located, the aperture having a slot-shaped cross-section perpendicular to an optical axis of said cylindrical lens; and,
   a magnetic lens having an optical axis and being combined with said cylindrical lens, said magnetic lens being a quadripole lens with which a quadripole field is able to be produced, said cylindrical lens and said magnetic lens being arranged with little, if any, distance between them and with the optical axis of said cylindrical lens and the optical axis of said magnetic lens running parallel to one another, said magnetic lens having a slot-shaped aperture oriented parallel to the aperture of said cylindrical lens, a focusing plane of said magnetic lens, which comprises the optical axis, is oriented parallel to a longitudinal axis of said aperture of said cylindrical lens and its defocusing plane is perpendicular to the longitudinal axis, with the refractive power of said cylindrical lens set at twice the refractive power of said magnetic lens.

2. The lens system for use in focusing electrons according to claim 1, wherein said the slot-shaped aperture of said magnetic lens is in a material having a high magnetic permeability with current-carrying conductors extending from edges of the slot-shaped aperture, the current-carrying conductors extending parallel to the optical axis of said magnetic lens, and with current flow in the current-carrying conductors, on opposing edges, being orientated parallel on the edges perpendicular thereto opposingly.

3. The lens system for use in focusing electrons according to claim 1, wherein the aperture of said cylindrical lens has a rectangular cross-section.

4. The lens system for use in focusing electrons according to claim 1, wherein the optical axis of said magnetic lens is able to be shifted parallel to the quadripole field.

5. The lens system for use in focusing electrons according to claim 4, wherein a magnetic dipole field is superimposable onto the quadripole field.

6. The lens system for use in focusing electrons according to claim 5, wherein opposing edges of the slot-shaped aperture of said magnetic lens are provided with conductors, said conductors being capable of being impinged with currents, which on both edges are opposing and of the same magnitude.

7. The lens system for use in focusing electrons according to claim 1, wherein high order multipole fields are superimposable onto the field of said magnetic lens.

8. The lens system for use in focusing electrons according to claim 1, wherein said magnetic lens is disposed in the direction of the optical axis of said cylindrical lens.

9. The lens system for use in focusing electrons according to claim 1, wherein said pole shoes of said cylindrical axis comprise a material of high magnetic permeability.

10. The lens system for use in focusing electrons according to claim 1, wherein said electrodes of said cylindrical axis comprise a material of high magnetic permeability.

11. The lens system for use in focusing electrons according to claim 1, wherein said cylindrical lens is an electrostatic lens.

12. The lens system for use in focusing electrons according to claim 11, wherein said cylindrical lens comprises a plurality of successive apertures in said electrodes in the direction of the optical axis, wherein one of said electrodes comprises pole shoes of said magnetic lens.

13. The lens system for use in focusing electrons according to claim 11, wherein said electrodes of said cylindrical lens have differing electric potentials.

14. The lens system for use in focusing electrons according to claim 1, wherein said cylindrical lens is, itself, a magnetic lens.

15. The lens system for use in focusing electrons according to claim 1, wherein said magnetic lens is able to be impinged with an electric field perpendicular to its optical axis.

16. The lens system for use in focusing electrons according to claim 15, wherein the optical axis of said magnetic lens is able to be shifted parallel to said quadripole field, and a magnetic dipole field is super-imposable onto the quadripole field, said electric field is orientated perpendicular to the longitudinal axis of the aperture, the magnetic dipole field is orientated parallel to the longitudinal axis of the aperture and the dynamic effect of both the electric field and the magnetic dipole field on moved, charged particles is opposed to each other.

17. The lens system for use in focusing electrons according to claim 1, wherein a focal point of said lens system lies on a surface of a workpiece, which is affixed in a workpiece clamping device, and which is displaceable perpendicular to the longitudinal axis of the aperture of said cylindrical lens.

* * * * *